(12) United States Patent
Liu et al.

(10) Patent No.: US 11,595,018 B2
(45) Date of Patent: Feb. 28, 2023

(54) FILM BULK ACOUSTIC RESONATOR INCLUDING RECESSED FRAME WITH SCATTERING SIDES

(71) Applicant: SKYWORKS GLOBAL PTE. LTD., Singapore (SG)

(72) Inventors: Jiansong Liu, Irvine, CA (US); Yuhao Liu, Los Angeles, CA (US); Li Chen, Irvine, CA (US); Yiliu Wang, Irvine, CA (US); Benjamin Paul Abbott, Irvine, CA (US); Kwang Jae Shin, Yongin (KR); Chun Sing Lam, San Jose, CA (US)

(73) Assignee: SKYWORKS GLOBAL PTE. LTD., Singapore (SG)

( * ) Notice: Subject to any disclaimer, the term of this patent is extended or adjusted under 35 U.S.C. 154(b) by 296 days.

(21) Appl. No.: 16/877,674

(22) Filed: May 19, 2020

(65) Prior Publication Data

US 2020/0373901 A1 Nov. 26, 2020

Related U.S. Application Data

(60) Provisional application No. 62/851,844, filed on May 23, 2019.

(51) Int. Cl.
| | | |
|---|---|---|
| *H03H 9/02* | (2006.01) | |
| *H03H 9/17* | (2006.01) | |
| *H03H 9/56* | (2006.01) | |
| *H03H 9/00* | (2006.01) | |
| *H03H 9/70* | (2006.01) | |
| *H04B 1/40* | (2015.01) | |

(52) U.S. Cl.
CPC ........ *H03H 9/0211* (2013.01); *H03H 9/0014* (2013.01); *H03H 9/02118* (2013.01); *H03H 9/173* (2013.01); *H03H 9/564* (2013.01); *H03H 9/706* (2013.01); *H04B 1/40* (2013.01)

(58) Field of Classification Search
CPC .... H03H 9/0211; H03H 9/0014; H03H 9/173; H03H 9/564; H03H 9/706; H03H 9/02118; H04B 1/40
USPC ......................... 333/133, 187, 188
See application file for complete search history.

(56) References Cited

U.S. PATENT DOCUMENTS

| | | | |
|---|---|---|---|
| 9,385,303 B2* | 7/2016 | Song ...................... H03H 9/174 |
| 2007/0057599 A1 | 3/2007 | Motai et al. |
| 2008/0024042 A1 | 1/2008 | Isobe et al. |
| 2010/0013573 A1 | 1/2010 | Umeda |
| 2012/0200195 A1 | 8/2012 | Yokoyama et al. |
| 2013/0033337 A1 | 2/2013 | Nishihara et al. |
| 2013/0106248 A1 | 5/2013 | Burak et al. |
| 2013/0193809 A1 | 8/2013 | Araki |
| 2014/0167566 A1 | 6/2014 | Kando |
| 2015/0214923 A1 | 7/2015 | Tsuzuki |
| 2016/0028371 A1 | 1/2016 | Nishihara et al. |

(Continued)

OTHER PUBLICATIONS

Li et al., "Use of double-raised-border structure for quality factor enhancement of type II piston mode FBAR", Microsystem Technologies, Berlin, Germany, vol. 24, No. 7, May 2018, pp. 2991-2997.

*Primary Examiner* — Rakesh B Patel
*Assistant Examiner* — Jorge L Salazar, Jr.
(74) *Attorney, Agent, or Firm* — Lando & Anastasi, LLP

(57) ABSTRACT

A film bulk acoustic wave resonator (FBAR) comprises a recessed frame region including an undulating perimeter.

24 Claims, 11 Drawing Sheets

(56) References Cited

U.S. PATENT DOCUMENTS

| | | | |
|---|---|---|---|
| 2016/0118958 A1 | 4/2016 | Burak et al. |
| 2016/0164487 A1 | 6/2016 | Shin et al. |
| 2017/0033769 A1 | 2/2017 | Yokoyama |
| 2017/0093374 A1 | 3/2017 | Yatsenko et al. |
| 2017/0214388 A1 | 7/2017 | Irieda et al. |
| 2018/0013401 A1 | 1/2018 | Lee et al. |
| 2018/0115302 A1 | 4/2018 | Yeh et al. |
| 2018/0309427 A1 | 10/2018 | Kim et al. |
| 2019/0115901 A1 | 4/2019 | Takahashi et al. |
| 2020/0083861 A1 | 3/2020 | Matsuo et al. |
| 2020/0168785 A1 | 5/2020 | Ikeuchi et al. |
| 2020/0350888 A1 | 11/2020 | Moulard |
| 2020/0366266 A1 | 11/2020 | Pollard et al. |
| 2020/0366271 A1 | 11/2020 | Kim et al. |
| 2020/0373911 A1 | 11/2020 | Wang et al. |
| 2021/0028765 A1 | 1/2021 | Wang et al. |

\* cited by examiner

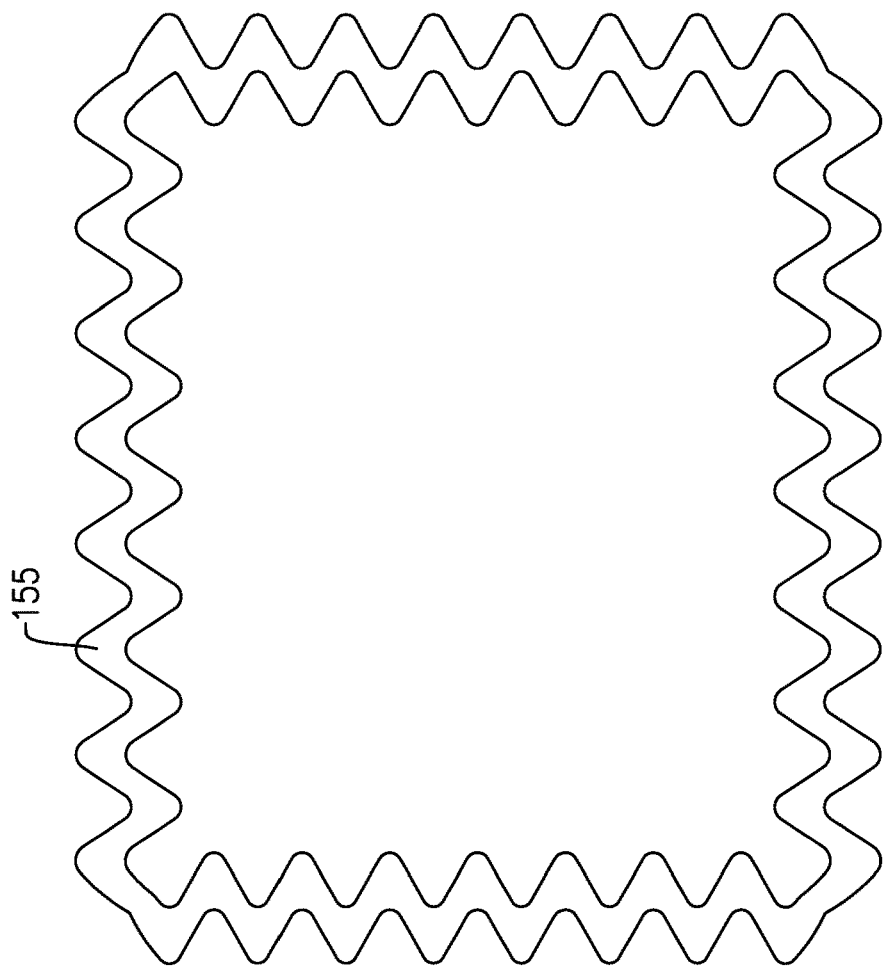
FIG.6
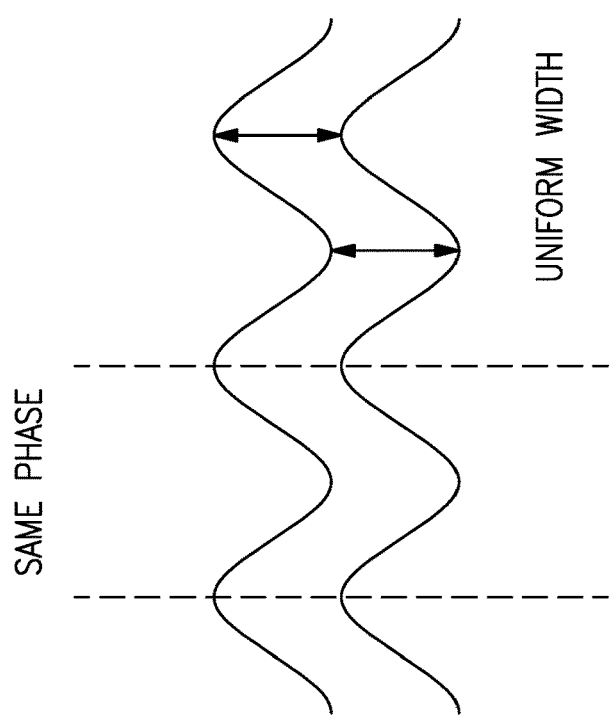

FILM BULK ACOUSTIC RESONATOR INCLUDING RECESSED FRAME WITH SCATTERING SIDES

CROSS-REFERENCE TO RELATED APPLICATIONS

This application claims priority under 35 U.S.C. § 119(e) to U.S. Provisional Patent Application Ser. No. 62/851,844, titled "FILM BULK ACOUSTIC RESONATOR INCLUDING RECESSED FRAME WITH SCATTERING SIDES," filed May 23, 2019 which is incorporated by reference herein in its entirety for all purposes.

BACKGROUND

Technical Field

Embodiments of this disclosure relate to acoustic wave devices and structures and methods of mitigating spurious signals in same.

Description of Related Technology

Acoustic wave devices, for example, bulk acoustic wave (BAW) devices may be utilized as components of filters in radio frequency electronic systems. For instance, filters in a radio frequency front end of a mobile phone can include acoustic wave filters. Two acoustic wave filters can be arranged as a duplexer.

SUMMARY

In accordance with one aspect, there is provided a film bulk acoustic wave resonator (FBAR) comprising a recessed frame region including an undulating perimeter.

In some embodiments, the undulating perimeter is an internal perimeter of the recessed frame region.

In some embodiments, an outer perimeter of the recessed frame region is non-undulating.

In some embodiments, the undulating perimeter is an outer perimeter of the recessed frame region.

In some embodiments, an inner perimeter of the recessed frame region is non-undulating.

In some embodiments, the recessed frame region includes both an undulating inner perimeter and an undulating outer perimeter. In some embodiments, undulation of the inner perimeter is in phase with undulation of the outer perimeter.

In some embodiments, undulation of the inner perimeter is out of phase with undulation of the outer perimeter.

In some embodiments, The FBAR further comprises a raised frame region including an undulating perimeter.

In some embodiments, the raised frame region includes an undulating inner perimeter.

In some embodiments, undulation of the perimeter is periodic.

In some embodiments, undulation of the perimeter is non-periodic.

In some embodiments, the recessed frame region is apodized.

In some embodiments, the recessed frame region is non-apodized.

In accordance with another aspect, there is provided a radio frequency filter comprising a film bulk acoustic wave resonator (FBAR) having a recessed frame region including an undulating perimeter.

In accordance with another aspect, there is provided an electronics module comprising a radio frequency filter including a film bulk acoustic wave resonator (FBAR) having a recessed frame region including an undulating perimeter.

In accordance with another aspect, there is provided an electronic device comprising an electronics module including a radio frequency filter having a film bulk acoustic wave resonator (FBAR) with a recessed frame region including an undulating perimeter.

BRIEF DESCRIPTION OF THE DRAWINGS

Embodiments of this disclosure will now be described, by way of non-limiting example, with reference to the accompanying drawings.

FIG. 6 illustrates a recessed frame region for a film bulk acoustic wave resonator having an undulating inner perimeter and an undulating outer perimeter;

DETAILED DESCRIPTION OF CERTAIN EMBODIMENTS

Figure 1:
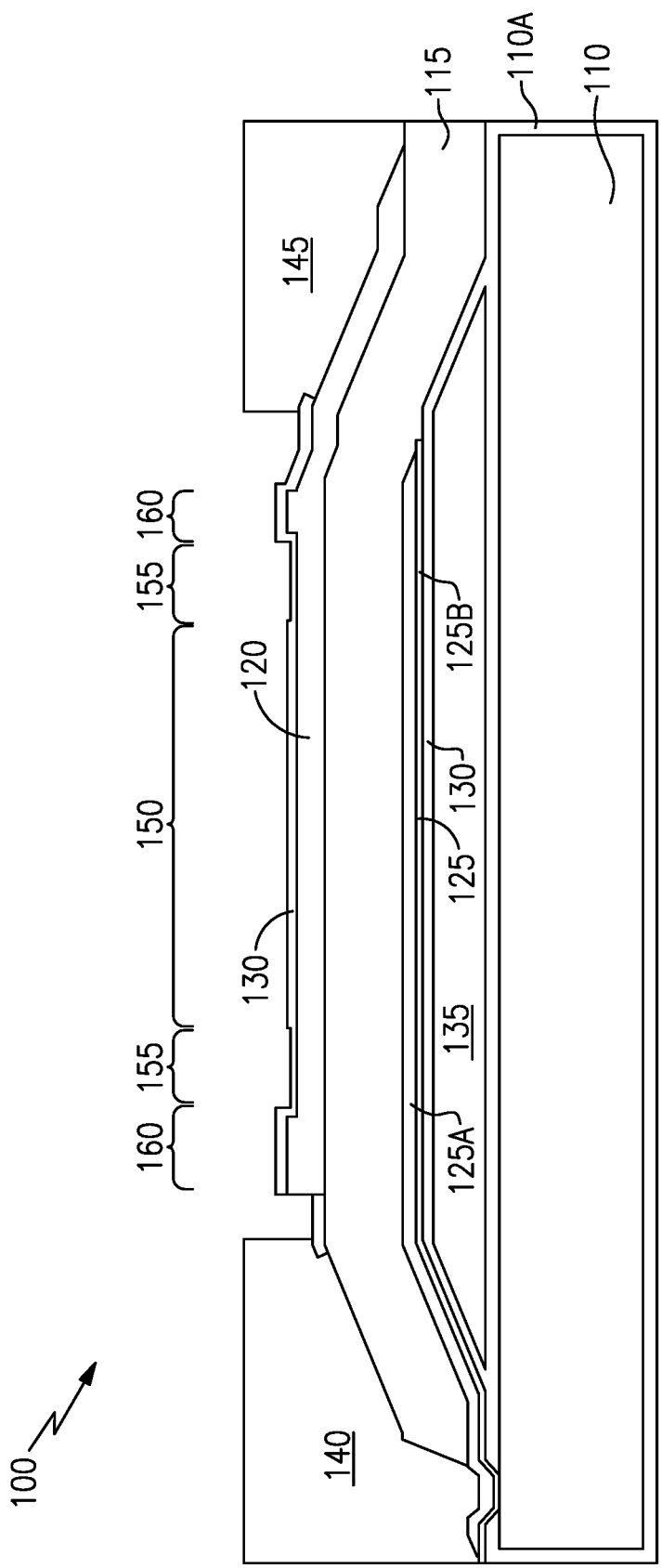
FIG. 1 is a cross-sectional view of an example of film bulk acoustic wave resonator.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Film bulk acoustic wave resonators (FBARs) are a form of bulk acoustic wave resonator that generally includes a film of piezoelectric material sandwiched between a top and a bottom electrode and suspended over a cavity that allows for the film of piezoelectric material to vibrate. A signal applied across the top and bottom electrodes causes an acoustic wave to be generated in and travel through the film of piezoelectric material. A FBAR exhibits a frequency response to applied signals with a resonance peak determined by a thickness of the film of piezoelectric material. Ideally, the only acoustic wave that would be generated in a FBAR is a main acoustic wave that would travel through the film of piezoelectric material in a direction perpendicular to layers of conducting material forming the top and bottom electrodes. The piezoelectric material of a FBAR, however, typically has a non-zero Poisson's ratio. Compression and relaxation of the piezoelectric material associated with passage of the main acoustic wave may thus cause compression and relaxation of the piezoelectric material in a direction perpendicular to the direction of propagation of the main acoustic wave. The compression and relaxation of the piezoelectric material in the direction perpendicular to the direction of propagation of the main acoustic wave may generate transverse acoustic waves that travel perpendicular to the main acoustic wave (parallel to the surfaces of the electrode films) through the piezoelectric material. The transverse acoustic waves may be reflected back into an area in which the main acoustic wave propagates and may induce spurious acoustic waves travelling in the same direction as the main acoustic wave. These spurious acoustic waves may degrade the frequency response of the FBAR from what is expected or from what is intended and are generally considered undesirable.

FIG. 1 is cross-sectional view of an example of a FBAR, indicated generally at 100. The FBAR 100 is disposed on a substrate 110, for example, a silicon substrate that may include a dielectric surface layer 110A of, for example, silicon dioxide. The FBAR 100 includes a layer or film of piezoelectric material 115, for example, aluminum nitride (AlN). A top electrode 120 is disposed on top of a portion of the layer or film of piezoelectric material 115 and a bottom electrode 125 is disposed on the bottom of a portion of the layer or film of piezoelectric material 115. The top electrode 120 may be formed of, for example, ruthenium (Ru). The bottom electrode 125 may include a layer 125A of Ru disposed in contact with the bottom of the portion of the layer or film of piezoelectric material 115 and a layer 125B of titanium (Ti) disposed on a lower side of the layer 125A of Ru opposite a side of the layer 125A of Ru in contact with the bottom of the portion of the layer or film of piezoelectric material 115. Each of the top electrode 120 and the bottom electrode 125 may be covered with a layer of dielectric material 130, for example, silicon dioxide. A cavity 135 is defined beneath the layer of dielectric material 130 covering the bottom electrode 125 and the surface layer 110A of the substrate 110. A bottom electrical contact 140 formed of, for example, copper may make electrical connection with the bottom electrode 125 and a top electrical contact 145 formed of, for example, copper may make electrical connection with the top electrode 120.

The FBAR 100 may include a central region 150 including a main active domain in the layer or film of piezoelectric material 115 in which a main acoustic wave is excited during operation. The central region may have a width of, for example, between about 20 µm and about 100 µm. A recessed frame region or regions 155 may bound and define the lateral extent of the central region 150. The recessed frame regions may have a width of, for example, about 1 µm. The recessed frame region(s) 155 may be defined by areas that have a thinner layer of dielectric material 130 on top of the top electrode 120 than in the central region 150. The dielectric material layer 130 in the recessed frame region(s) 155 may be from about 10 nm to about 100 nm thinner than the dielectric material layer 130 in the central region 150. The difference in thickness of the dielectric material in the recessed frame region(s) 155 vs. in the central region 150 may cause the resonant frequency of the device in the recessed frame region(s) 155 to be between about 5 MHz to about 50 MHz higher than the resonant frequency of the device in the central region 150. In some embodiments, the thickness of the dielectric material layer 130 in the central region 150 may be about 200 nm to about 300 nm and the thickness of the dielectric material layer 130 in the recessed frame region(s) 155 may be about 100 nm. The dielectric film 300 in the recessed frame region(s) 155 is typically etched during manufacturing to achieve a desired difference in acoustic velocity between the central region 150 and the recessed frame region(s) 155. Accordingly, the dielectric film 300 initially deposited in both the central region 150 and recessed frame region(s) 155 is deposited with a sufficient thickness that allows for etching of sufficient dielectric film 300 in the recessed frame region(s) 155 to achieve a desired difference in thickness of the dielectric film 300 in the central region 150 and recessed frame region(s) 155 to achieve a desired acoustic velocity difference between these regions.

A raised frame region or regions 160 may be defined on an opposite side of the recessed frame region(s) 155 from the central region 150 and may directly abut the outside edge(s) of the recessed frame region(s) 155. The raised frame regions may have widths of, for example, about 1 µm. The raised frame region(s) 160 may be defined by areas where the top electrode 120 is thicker than in the central region 150 and in the recessed frame region(s) 155. The top electrode 120 may have the same thickness in the central region 150 and in the recessed frame region(s) 155 but a greater thickness in the raised frame region(s) 160. The top electrode 120 may be between about 50 nm and about 500 nm thicker in the raised frame region(s) 160 than in the central region 150 and/or in the recessed frame region(s) 155. In some embodiments the thickness of the top electrode in the central region may be between 50 and 500 nm. The recessed frame region(s) 155 and the raised frame region(s) 160 may contribute to dissipation or scattering of transverse acoustic waves generated in the FBAR 100 during operation and/or may reflect transverse waves propagating outside of the recessed frame region(s) 155 and the raised frame region(s) 160 and prevent these transverse acoustic waves from entering the central region and inducing spurious signals in the main active domain region of the FBAR. Without being bound to a particular theory, it is believed that due to the thinner layer of dielectric material 130 on top of the top electrode 120 in the recessed frame region(s) 155, the recessed frame region(s) 155 may exhibit a higher velocity of propagation of acoustic waves than the central region 150. Conversely, due to the increased thickness and mass of the top electrode 120 in the raised frame region(s) 160, the raised frame regions(s) 160 may exhibit a lower velocity of propagation of acoustic waves than the central region 150 and a lower velocity of propagation of acoustic waves than the recessed frame region(s) 155. The discontinuity in acoustic wave velocity between the recessed frame region(s) 155 and the raised frame region(s) 160 creates a barrier that scatters, suppresses, and/or reflects transverse acoustic waves. The presence of the raised frame regions(s) 160 may also increase the quality factor Q of the FBAR 100.

Figure 2:
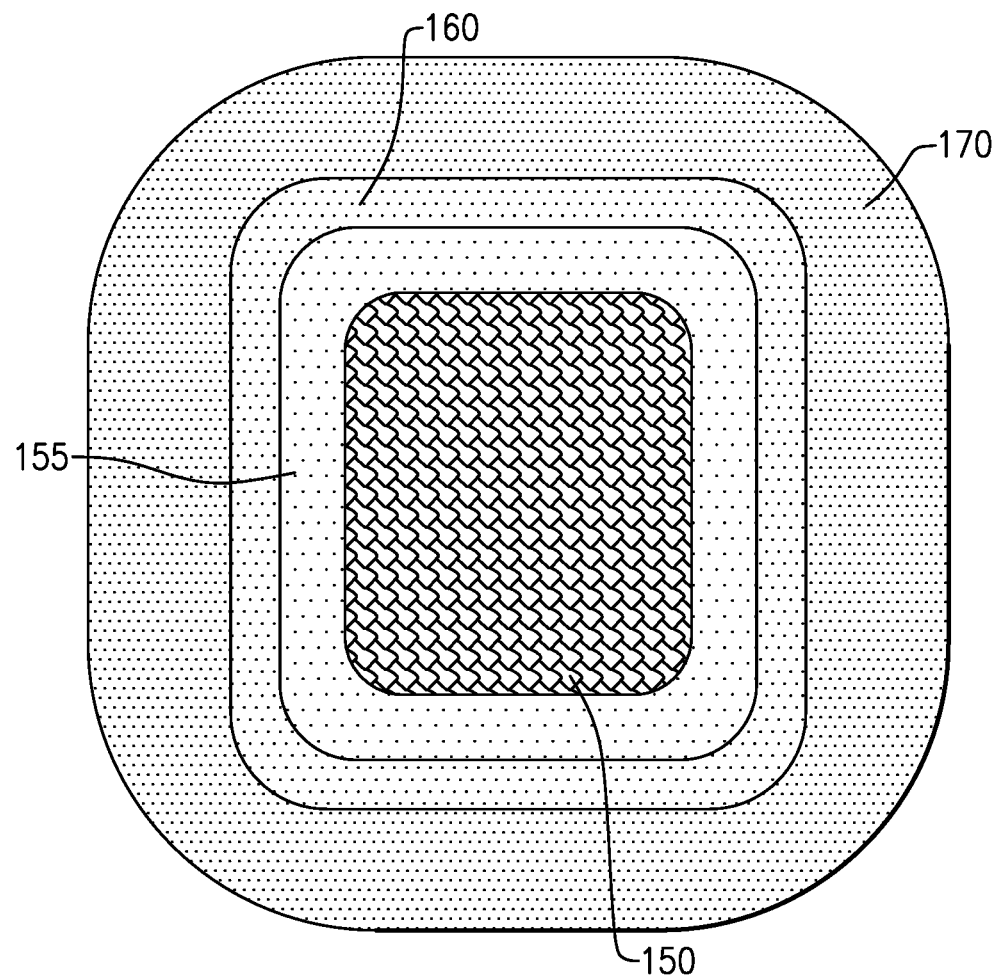
FIG. 2 is a plan view of an example of a film bulk acoustic wave resonator.

A plan view of an example of a FBAR is illustrated in FIG. 2. The FBAR structure illustrated in FIG. 2 has a regular, symmetric shape. The core active central region 150 is in the shape of a rounded square. The recessed frame region 155 and raised frame region 160 are in the form of rounded rectangular rings circumscribing the core active central region 150. Region 170 is outside of the FBAR structure.

Figure 3:
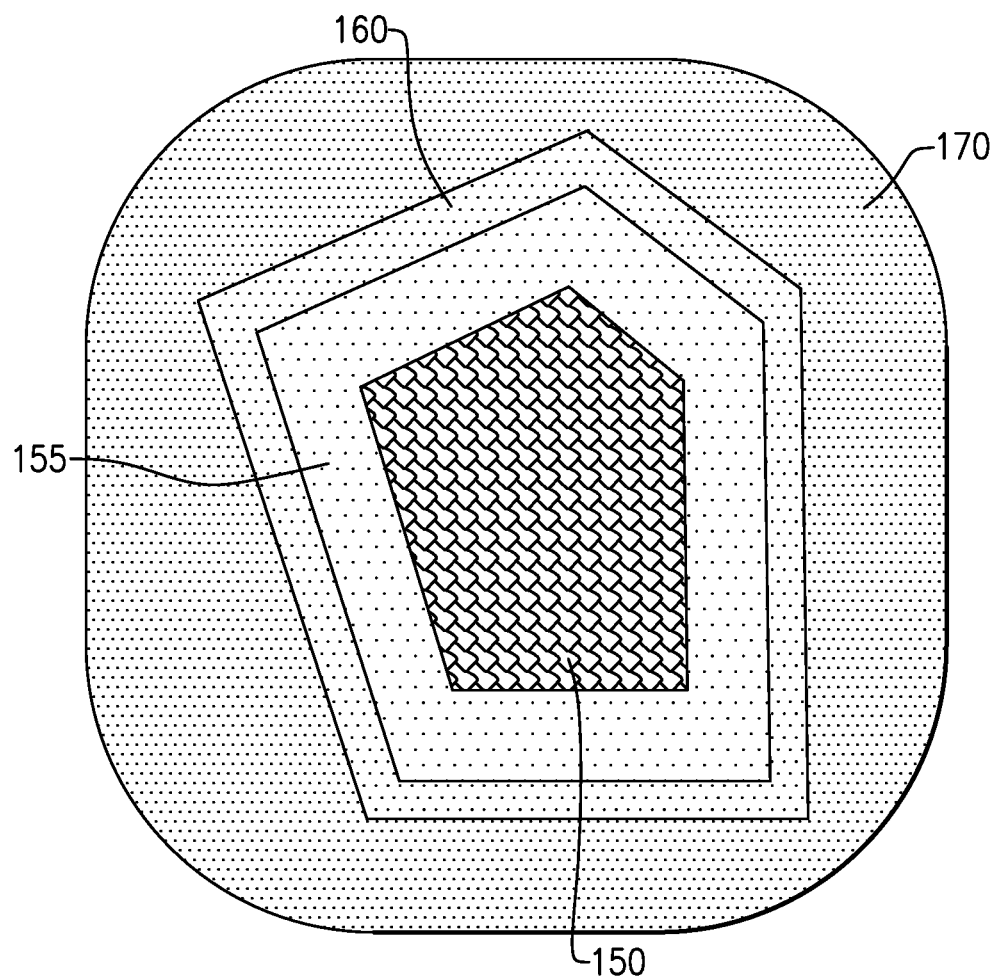
FIG. 3 is a plan view of another example of a film bulk acoustic wave resonator.

A plan view of another example of a FBAR is illustrated in FIG. 3. The FBAR structure illustrated in FIG. 3 has an irregular apodized shape. The non-symmetric boundaries of the core active central region 150 and recessed frame region 155 and raised frame region 160 may help suppress transverse mode spurious waves by scattering of these transverse mode spurious waves.

It has been recognized that FBAR structures such as illustrated in the figures above may be improved upon. For example, it has been found that FBAR structures such as illustrated in the figures above may exhibit transverse mode spurious waves that are stronger than desirable, especially in frequencies above the resonant frequency of the FBAR. These undesirable transverse mode spurious waves may be excited by the $S_0$ vibrational mode of the FBAR.

Figure 4:
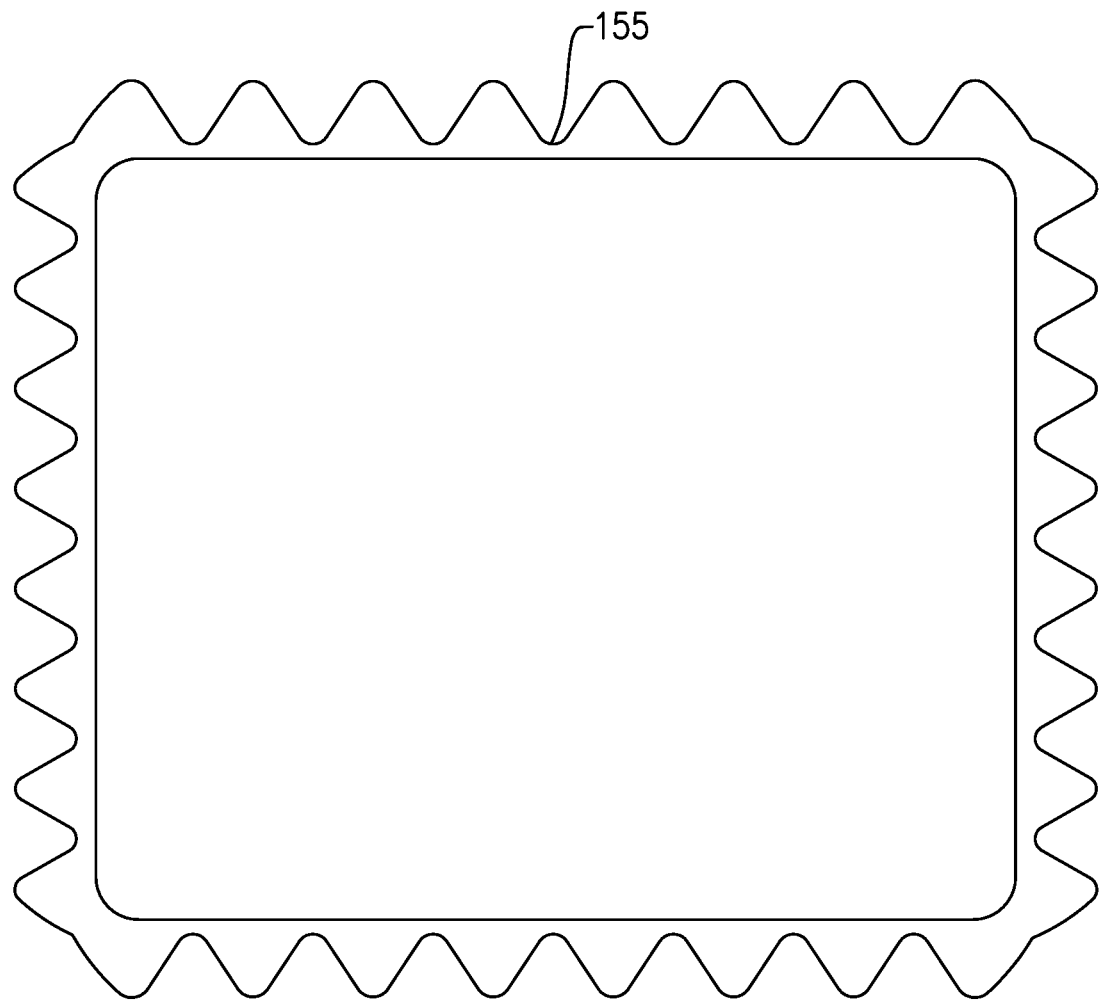
FIG. 4 illustrates a recessed frame region for a film bulk acoustic wave resonator having an undulating outer perimeter.

Undesirable transverse mode spurious waves may be further suppressed in an FBAR structure by intruding irregularities into the recessed frame regions 155 and/or raised frame regions 160. FIG. 4 illustrates one example of a recessed frame region 155 of an FBAR, illustrated in isolation without the remaining components of the FBAR, in which the recessed frame region 155 has an undulating outer perimeter. The outer perimeter of the recessed frame region 155, and, accordingly, the width of the recessed frame region 155 and the internal perimeter (and thickness) of the raised frame region bounding the recessed frame region 155 may vary in a sinusoidal manner. The sinusoidal pattern on the outer perimeter of the recessed frame region 155 may have a period of, for example, from about 2 μm to about 3 μm, although larger or smaller periods are also possible in different embodiments.

Figure 5:
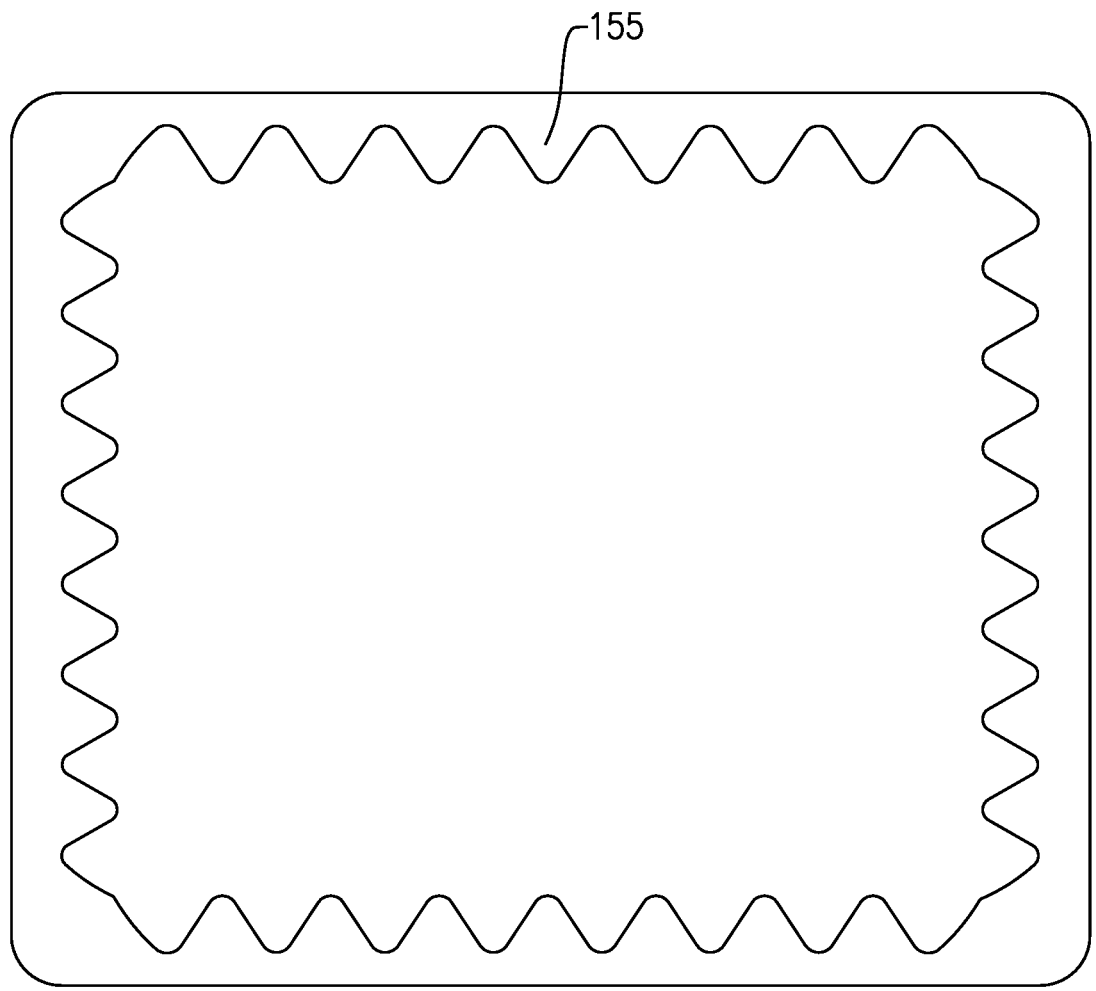
FIG. 5 illustrates a recessed frame region for a film bulk acoustic wave resonator having an undulating inner perimeter.

In another example, illustrated in FIG. 5, the inner perimeter of the recessed frame region 155, and, accordingly, the width of the recessed frame region 155 may exhibit an undulating or sinusoidally varying pattern. The sinusoidal pattern on the inner perimeter of the recessed frame region 155 may have a period of, for example, from about 2 μm to about 3 μm, although larger or smaller periods are also possible in different embodiments.

Figure 7:
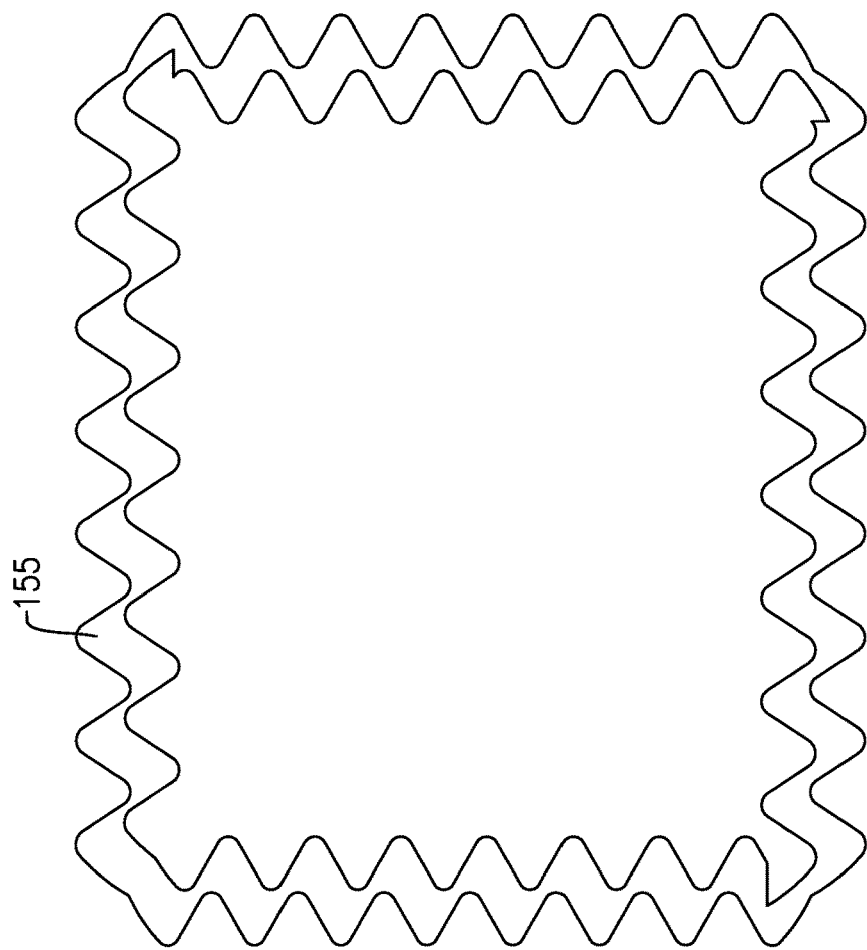
FIG. 7 illustrates another recessed frame region for a film bulk acoustic wave resonator having an undulating inner perimeter and an undulating outer perimeter.
Figure 7:
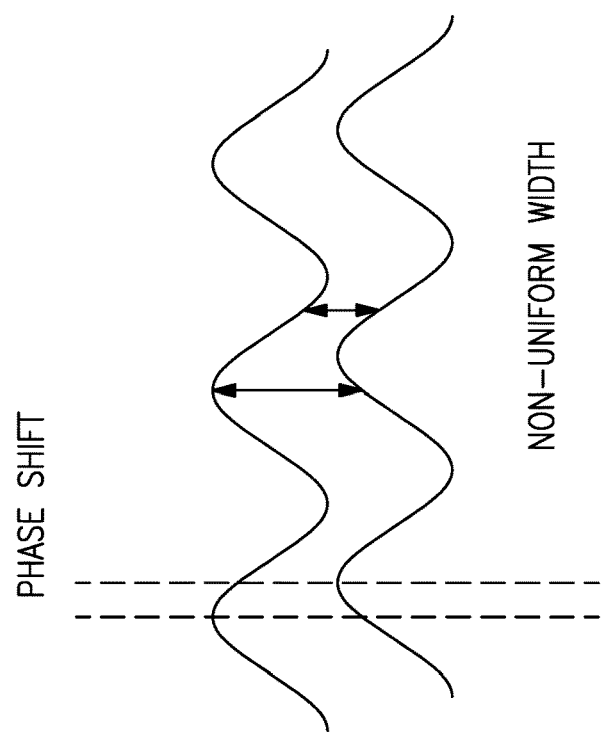
Figure 8:
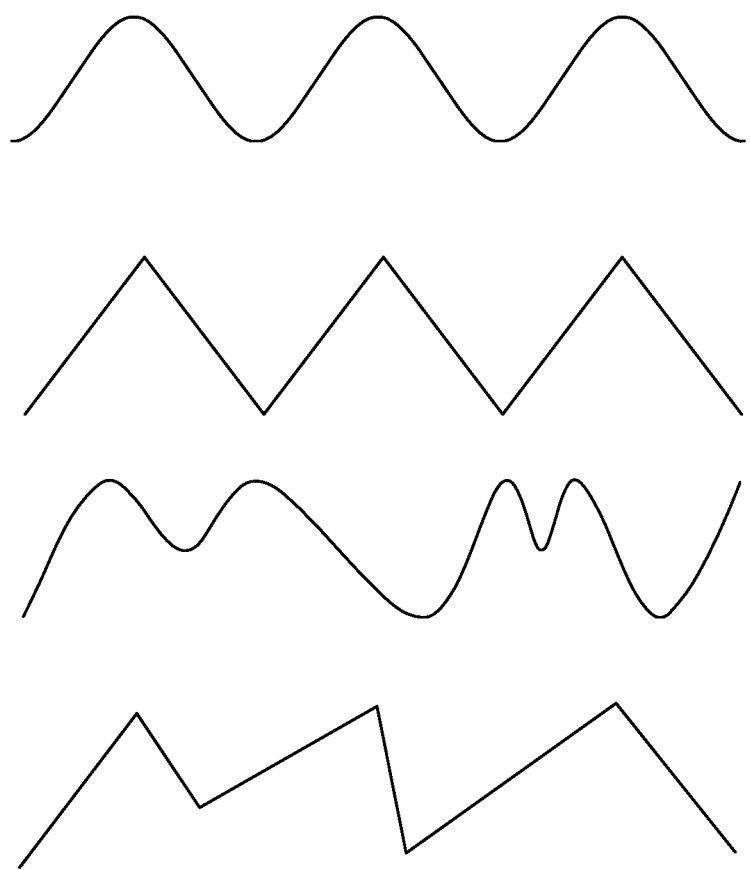
FIG. 8 illustrates different patterns that may be exhibited by inner and/or outer perimeters of a recessed frame region for a film bulk acoustic wave resonator.

In further embodiments, the features of the recessed frame regions 155 illustrated in FIGS. 4 and 5 may be combined, for example, as a recessed frame region 155 including both inner and outer perimeters exhibiting undulating or sinusoidally varying patterns. In some embodiments, as illustrated in FIG. 6, the undulating or sinusoidally varying patterns defined by the inner and outer perimeters of the recessed frame region may be in phase. The recessed frame region may thus have a substantially uniform or similar width about a majority of its perimeter. In other embodiments, as illustrated in FIG. 7, the undulating or sinusoidally varying patterns defined by the inner and outer perimeters of the recessed frame region may be out of phase or phase shifted. The recessed frame region may thus have a non-uniform width that varies about its perimeter. The undulations in the inner and outer perimeters of the recessed frame region in FIGS. 6 and 7 are illustrated as having similar periods, but in other embodiments the periods of the patterns in the inner and outer perimeters of the recessed frame region may be different. Further, in some embodiments, the inner periphery of the recessed frame region may exhibit a differently shaped pattern than the outer perimeter of the recessed frame region. FIG. 8 illustrates different patterns that may be exhibited by the inner perimeter of the recessed frame region and/or the outer perimeter of the recessed frame region. The patterns that may be exhibited by the inner perimeter of the recessed frame region and/or the outer perimeter of the recessed frame region may be periodic or non-periodic and may exhibit the same amplitude of variation or different amplitudes of variation along lengths of the inner and/or outer perimeters of the recessed frame region.

The different forms of recessed frame regions including undulating perimeters have been illustrated herein as having a substantially square or rectangular shape. It should be appreciated that recessed frame regions of FBARs including undulating perimeters may, in other embodiments, be apodized, for example, in a manner similar to that illustrated in FIG. 3, but with the inclusion of undulations as disclosed herein.

Figure 9:
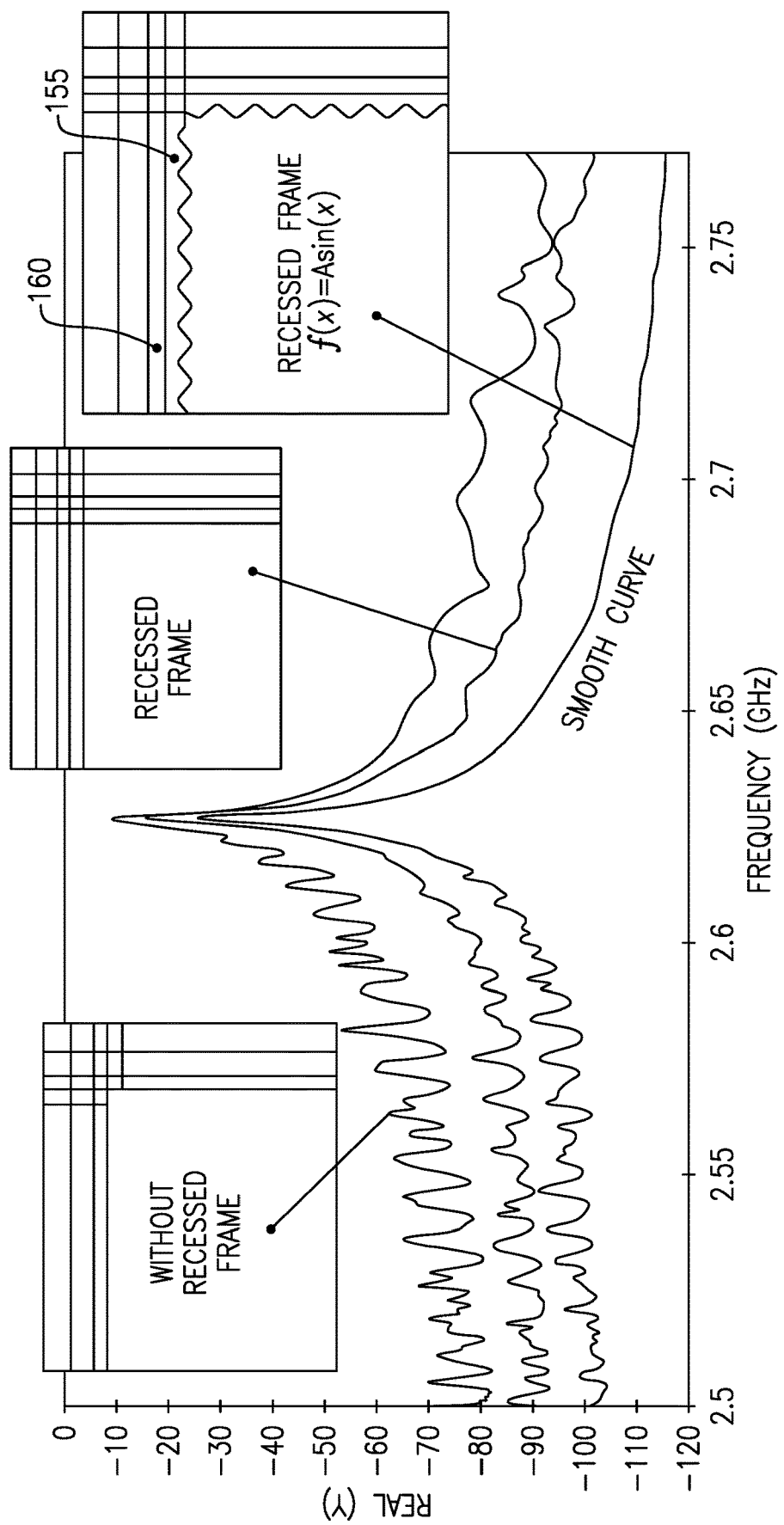
FIG. 9 illustrates results of simulations of the effect of different recessed frame structures on the frequency response of a film bulk acoustic wave resonator.

FIG. 9 illustrates results of simulations of the effect of different recessed frame structures on admittance of an FBAR resonator. As illustrated in FIG. 9, when no recessed frame is present, the admittance curve exhibits a great deal of spurious signals that are more pronounced below the main resonant frequency of the resonator and is not very sharp. Including a recessed frame with a uniform thickness and linear walls reduces the amount of spurious signals and increases the sharpness of the admittance curve. Including a recessed frame with an inner perimeter including sinusoidally varying edge (an edge defining a curve having the equation $f(x)=A\sin(x)$, A≤recessed frame width) reduces the amount of spurious signals, particularly at frequencies above the main resonant frequency of the resonator, and increases the sharpness of the admittance curve even further. This simulation illustrates that FBARs including non-uniform recessed frame regions as disclosed herein may exhibit less transverse mode spurious signals that preciously known FBAR structures, particularly at frequencies above the main resonant frequency of the resonator.

Figure 10:
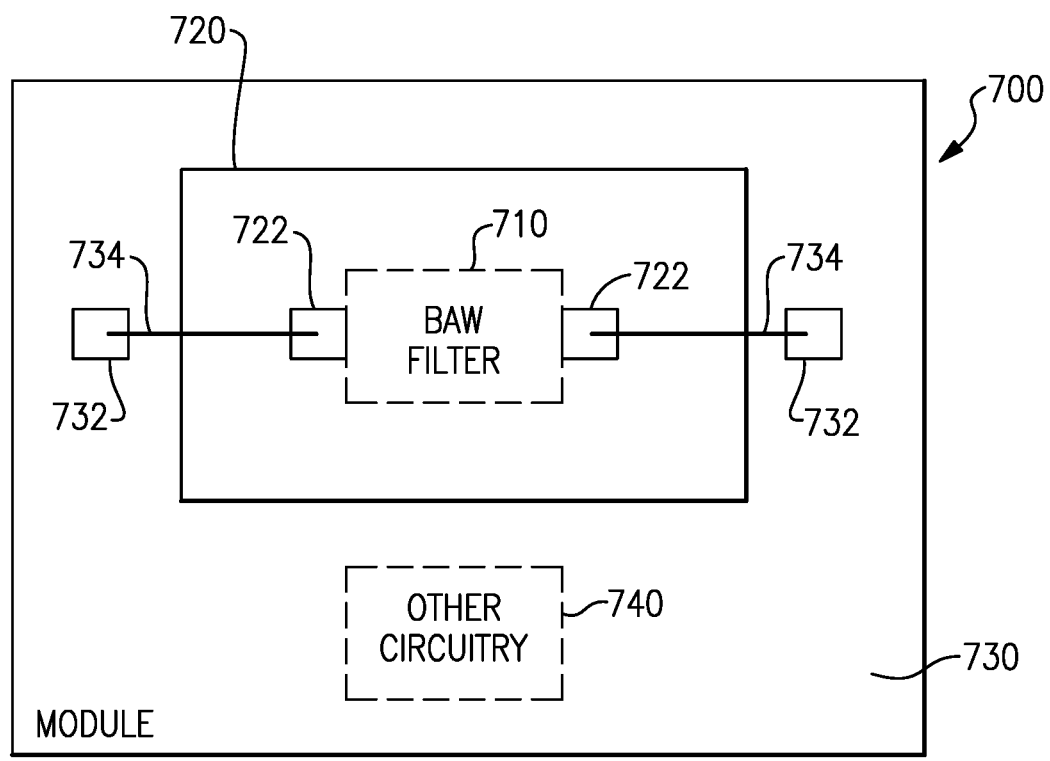
FIG. 10 is a block diagram of one example of a filter module that can include one or more acoustic wave elements according to aspects of the present disclosure.
Figure 11:
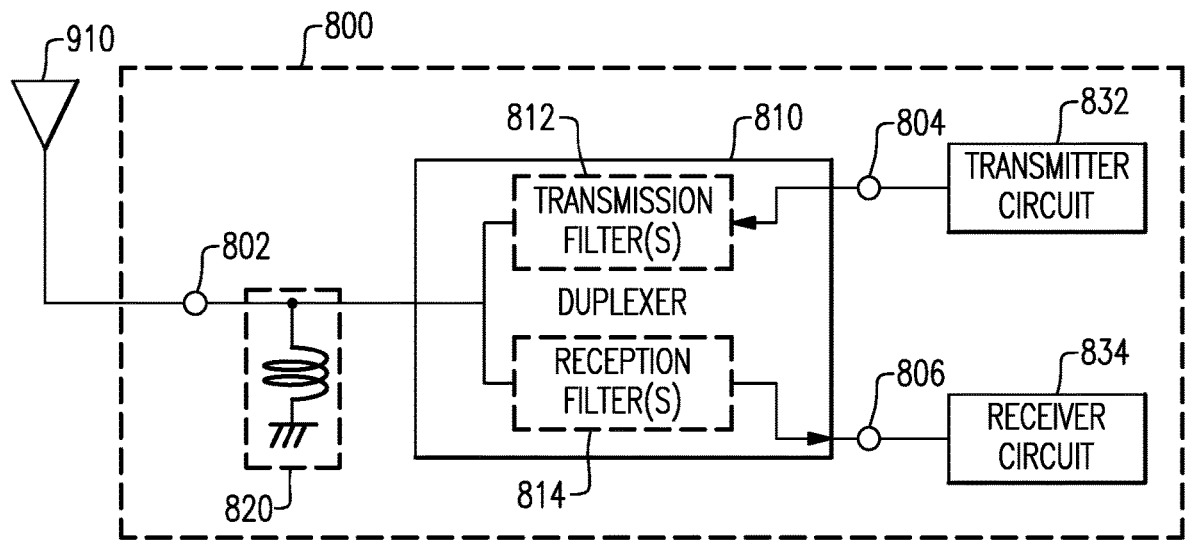
FIG. 11 is a block diagram of one example of a front-end module that can include one or more filter modules according to aspects of the present disclosure.
Figure 12:
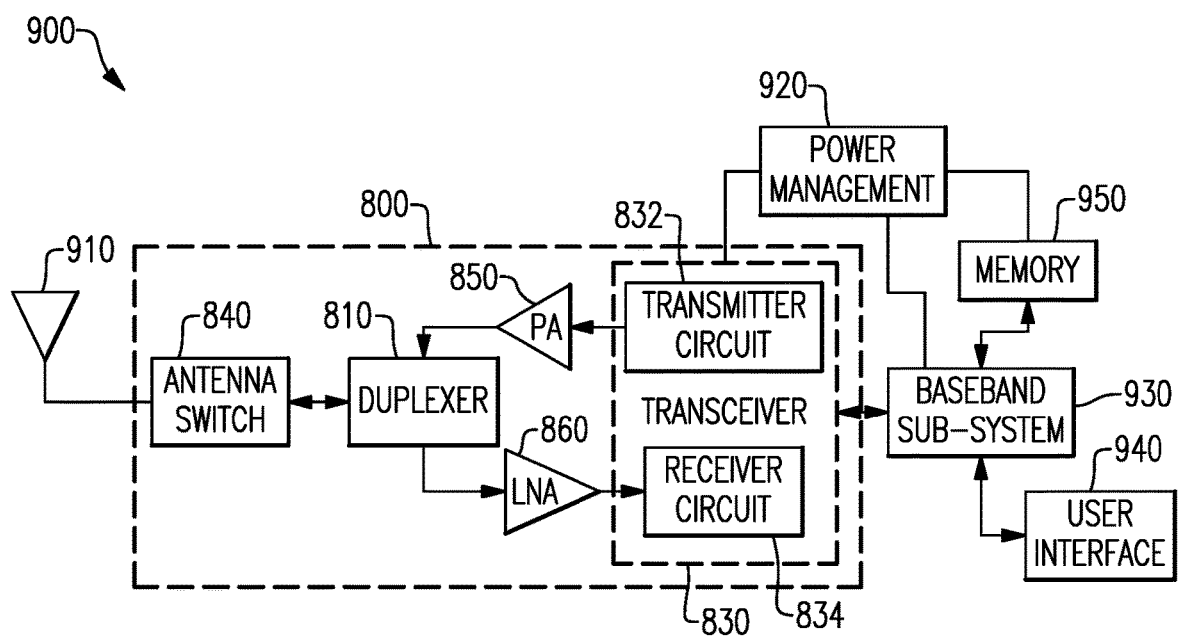
FIG. 12 is a block diagram of one example of a wireless device including the front-end module of FIG. 11.

The acoustic wave devices discussed herein can be implemented in a variety of packaged modules. Some example packaged modules will now be discussed in which any suitable principles and advantages of the packaged acoustic wave devices discussed herein can be implemented. FIGS. 10, 11, and 12 are schematic block diagrams of illustrative packaged modules and devices according to certain embodiments.

As discussed above, embodiments of the disclosed FBARs can be configured as or used in filters, for example. In turn, a FBAR filter using one or more FBAR elements may be incorporated into and packaged as a module that may ultimately be used in an electronic device, such as a wireless communications device, for example. FIG. 10 is a block diagram illustrating one example of a module 700 including a bulk acoustic wave (BAW) filter 710.

The BAW filter 710 may include one or more FBAR resonators as disclosed herein. The BAW filter 710 may be implemented on one or more die(s) 720 including one or more connection pads 722. For example, the BAW filter 710 may include a connection pad 722 that corresponds to an input contact for the FBAR filter and another connection pad 722 that corresponds to an output contact for the FBAR filter. The packaged module 700 includes a packaging substrate 730 that is configured to receive a plurality of components, including the die 720. A plurality of connection pads 732 can be disposed on the packaging substrate 730, and the various connection pads 722 of the FBAR filter die 720 can be connected to the connection pads 732 on the packaging substrate 730 via electrical connectors 734, which can be solder bumps or wirebonds, for example, to allow for passing of various signals to and from the BAW filter 710. The module 700 may optionally further include other circuitry die 740, such as, for example one or more additional filter(s), amplifiers, pre-filters, modulators, demodulators, down converters, and the like, as would be known to one of skill in the art of semiconductor fabrication in view of the disclosure herein. In some embodiments, the module 700 can also include one or more packaging structures to, for example, provide protection and facilitate easier handling of the module 700. Such a packaging structure can include an overmold formed over the packaging substrate 730 and dimensioned to substantially encapsulate the various circuits and components thereon.

Various examples and embodiments of the BAW filter 710 can be used in a wide variety of electronic devices. For example, the BAW filter 710 can be used in an antenna duplexer, which itself can be incorporated into a variety of electronic devices, such as RF front-end modules and communication devices.

Referring to FIG. 11, there is illustrated a block diagram of one example of a front-end module 800, which may be used in an electronic device such as a wireless communications device (e.g., a mobile phone) for example. The front-end module 800 includes an antenna duplexer 810 having a common node 802, an input node 804, and an output node 806. An antenna 910 is connected to the common node 802.

The antenna duplexer 810 may include one or more transmission filters 812 connected between the input node 804 and the common node 802, and one or more reception filters 814 connected between the common node 802 and the output node 806. The passband(s) of the transmission filter(s) are different from the passband(s) of the reception filters. Examples of the BAW filter 710 can be used to form the transmission filter(s) 812 and/or the reception filter(s) 814. An inductor or other matching component 820 may be connected at the common node 802.

The front-end module 800 further includes a transmitter circuit 832 connected to the input node 804 of the duplexer 810 and a receiver circuit 834 connected to the output node 806 of the duplexer 810. The transmitter circuit 832 can generate signals for transmission via the antenna 910, and the receiver circuit 834 can receive and process signals received via the antenna 910. In some embodiments, the receiver and transmitter circuits are implemented as separate components, as shown in FIG. 11, however in other embodiments these components may be integrated into a common transceiver circuit or module. As will be appreciated by those skilled in the art, the front-end module 800 may include other components that are not illustrated in FIG. 11 including, but not limited to, switches, electromagnetic couplers, amplifiers, processors, and the like.

FIG. 12 is a block diagram of one example of a wireless device 900 including the antenna duplexer 810 shown in FIG. 11. The wireless device 900 can be a cellular phone, smart phone, tablet, modem, communication network or any other portable or non-portable device configured for voice or data communication. The wireless device 900 can receive and transmit signals from the antenna 910. The wireless device includes an embodiment of a front-end module 800 similar to that discussed above with reference to FIG. 11. The front-end module 800 includes the duplexer 810, as discussed above. In the example shown in FIG. 12 the front-end module 800 further includes an antenna switch 840, which can be configured to switch between different frequency bands or modes, such as transmit and receive modes, for example. In the example illustrated in FIG. 12, the antenna switch 840 is positioned between the duplexer 810 and the antenna 910; however, in other examples the duplexer 810 can be positioned between the antenna switch 840 and the antenna 910. In other examples the antenna switch 840 and the duplexer 810 can be integrated into a single component.

The front-end module 800 includes a transceiver 830 that is configured to generate signals for transmission or to process received signals. The transceiver 830 can include the transmitter circuit 832, which can be connected to the input node 804 of the duplexer 810, and the receiver circuit 834, which can be connected to the output node 806 of the duplexer 810, as shown in the example of FIG. 11.

Signals generated for transmission by the transmitter circuit 832 are received by a power amplifier (PA) module 850, which amplifies the generated signals from the transceiver 830. The power amplifier module 850 can include one or more power amplifiers. The power amplifier module 850 can be used to amplify a wide variety of RF or other frequency-band transmission signals. For example, the power amplifier module 850 can receive an enable signal that can be used to pulse the output of the power amplifier to aid in transmitting a wireless local area network (WLAN) signal or any other suitable pulsed signal. The power amplifier module 850 can be configured to amplify any of a variety of types of signal, including, for example, a Global System for Mobile (GSM) signal, a code division multiple access (CDMA) signal, a W-CDMA signal, a Long-Term Evolution (LTE) signal, or an EDGE signal. In certain embodiments, the power amplifier module 850 and associated components including switches and the like can be fabricated on gallium arsenide (GaAs) substrates using, for example, high-electron mobility transistors (pHEMT) or insulated-gate bipolar transistors (BiFET), or on a Silicon substrate using complementary metal-oxide semiconductor (CMOS) field effect transistors.

Still referring to FIG. 12, the front-end module 800 may further include a low noise amplifier module 860, which amplifies received signals from the antenna 910 and provides the amplified signals to the receiver circuit 834 of the transceiver 830.

The wireless device 900 of FIG. 12 further includes a power management sub-system 920 that is connected to the transceiver 830 and manages the power for the operation of the wireless device 900. The power management system 920 can also control the operation of a baseband sub-system 930 and various other components of the wireless device 900. The power management system 920 can include, or can be connected to, a battery (not shown) that supplies power for the various components of the wireless device 900. The power management system 920 can further include one or more processors or controllers that can control the transmission of signals, for example. In one embodiment, the baseband sub-system 930 is connected to a user interface 940 to facilitate various input and output of voice and/or data provided to and received from the user. The baseband sub-system 930 can also be connected to memory 950 that is configured to store data and/or instructions to facilitate the operation of the wireless device, and/or to provide storage of information for the user. Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a range from about 30 kHz to 300 GHz, such as in a range from about 450 MHz to 6 GHz.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A film bulk acoustic wave resonator (FBAR) comprising a recessed frame region including an undulating perimeter, the undulation of the perimeter being periodic.

2. The FBAR of claim 1 wherein the undulating perimeter is an internal perimeter of the recessed frame region.

3. The FBAR of claim 2 wherein an outer perimeter of the recessed frame region is non-undulating.

4. The FBAR of claim 2 further comprising a raised frame region including an undulating perimeter.

5. The FBAR of claim 4 wherein the raised frame region includes an undulating inner perimeter.

6. The FBAR of claim 1 wherein the undulating perimeter is an outer perimeter of the recessed frame region.

7. The FBAR of claim 6 wherein an inner perimeter of the recessed frame region is non-undulating.

8. The FBAR of claim 6 further comprising a raised frame region including an undulating perimeter.

9. The FBAR of claim 1 wherein the recessed frame region includes both an undulating inner perimeter and an undulating outer perimeter.

10. The FBAR of claim 9 wherein the undulation of the inner perimeter is in phase with the undulation of the outer perimeter.

11. The FBAR of claim 9 wherein the undulation of the inner perimeter is out of phase with the undulation of the outer perimeter.

12. The FBAR of claim 1 further comprising a raised frame region including an undulating perimeter.

13. The FBAR of claim 12 wherein the raised frame region includes an undulating inner perimeter.

14. The FBAR of claim 1 wherein the recessed frame region is apodized.

15. The FBAR of claim 1 wherein the recessed frame region is non-apodized.

16. A film bulk acoustic wave resonator (FBAR) comprising an apodized recessed frame region including an undulating perimeter.

17. The FBAR of claim 16 wherein the undulation of the perimeter is periodic.

18. The FBAR of claim 16 wherein the undulation of the perimeter is non-periodic.

19. An electronics module comprising a radio frequency filter including a film bulk acoustic wave resonator (FBAR) having an apodized recessed frame region including an undulating perimeter.

20. An electronic device comprising an electronics module including a radio frequency filter having a film bulk acoustic wave resonator (FBAR) with a recessed frame region including an undulating outer perimeter and a raised frame region including an undulating perimeter.

21. A film bulk acoustic wave resonator (FBAR) comprising a recessed frame region including an undulating internal perimeter, an outer perimeter of the recessed frame region being non-undulating.

22. A film bulk acoustic wave resonator (FBAR) comprising a recessed frame region including an undulating outer perimeter, an inner perimeter of the recessed frame region being non-undulating.

23. A film bulk acoustic wave resonator (FBAR) comprising:
   a recessed frame region including an undulating outer perimeter; and
   a raised frame region including an undulating perimeter.

24. A radio frequency filter comprising a film bulk acoustic wave resonator (FBAR) having a recessed frame region including an undulating perimeter, the undulation of the perimeter being periodic.

\* \* \* \* \*